(12) United States Patent
Kim

(10) Patent No.: US 12,142,071 B2
(45) Date of Patent: Nov. 12, 2024

(54) ELECTRONIC DEVICE INCLUDING FINGERPRINT SENSOR

(71) Applicant: Samsung Electronics Co., Ltd., Suwon-si (KR)

(72) Inventor: Junghyung Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/172,527

(22) Filed: Feb. 22, 2023

(65) Prior Publication Data

US 2023/0196821 A1      Jun. 22, 2023

Related U.S. Application Data

(63) Continuation of application No. PCT/KR2022/012523, filed on Aug. 22, 2022.

(30) Foreign Application Priority Data

Oct. 7, 2021 (KR) .................... 10-2021-0133275

(51) Int. Cl.
| | |
|---|---|
| G06V 40/13 | (2022.01) |
| G09G 3/00 | (2006.01) |
| H04M 1/02 | (2006.01) |

(52) U.S. Cl.
CPC ......... G06V 40/1318 (2022.01); G09G 3/035 (2020.08); H04M 1/0237 (2013.01); H04M 1/0268 (2013.01); *G09G 2354/00* (2013.01)

(58) Field of Classification Search
None
See application file for complete search history.

(56) References Cited

U.S. PATENT DOCUMENTS

| | | |
|---|---|---|
| 10,430,630 B2 | 10/2019 | Zhang |
| 10,754,386 B2 | 8/2020 | Lee et al. |
| (Continued) | | |

FOREIGN PATENT DOCUMENTS

| | | |
|---|---|---|
| CN | 110519432 A | 11/2019 |
| CN | 110709860 A | 1/2020 |
| (Continued) | | |

OTHER PUBLICATIONS

International Search Report dated Dec. 2, 2022, issued in International Patent Application No. PCT/KR2022/012523.

*Primary Examiner* — Joseph R Haley
(74) *Attorney, Agent, or Firm* — Jefferson IP Law, LLP

(57) ABSTRACT

An electronic device is provided. The electronic device includes a housing including a first housing and a second housing connected to the first housing to slide within a designated range, a flexible display including a display panel and a reinforcing sheet, the flexible display including a first portion and a second portion extended from the first portion, and drawn in or out of the housing as the second housing moves with respect to the first housing, a circuit board, and a fingerprint sensor spaced from a rear surface of the flexible display, and disposed on the circuit board. The reinforcing sheet may include a first opening area disposed between the fingerprint sensor and the display panel with the second portion drawn in and a second opening area disposed between the fingerprint sensor and the display panel with the second portion drawn out.

24 Claims, 19 Drawing Sheets

(56) References Cited

U.S. PATENT DOCUMENTS

| | | |
|---|---|---|
| 11,048,294 B2 | 6/2021 | Yin et al. |
| 11,080,502 B2 | 8/2021 | Lee et al. |
| 11,221,696 B2 | 1/2022 | Kim et al. |
| 11,223,108 B2 | 1/2022 | Choi et al. |
| 2017/0364122 A1 | 12/2017 | Kim et al. |
| 2018/0035024 A1* | 2/2018 | Eromäki ............... H04N 23/54 |
| 2018/0089485 A1 | 3/2018 | Bok |
| 2018/0217679 A1 | 8/2018 | Kwon et al. |
| 2019/0244002 A1* | 8/2019 | Ye ......................... H10K 50/80 |
| 2020/0134283 A1* | 4/2020 | Qing .................. G06V 40/1318 |
| 2021/0142028 A1* | 5/2021 | Zhou ................... G02F 1/13338 |
| 2021/0326557 A1 | 10/2021 | Lee et al. |
| 2022/0166861 A1* | 5/2022 | Lim ....................... G06F 1/1624 |
| 2023/0042511 A1* | 2/2023 | Cheng .................... G06F 3/041 |
| 2023/0305603 A1* | 9/2023 | Hu ........................ G06F 1/1686 |

FOREIGN PATENT DOCUMENTS

| | | |
|---|---|---|
| CN | 111290522 A | 6/2020 |
| CN | 212749851 U | 3/2021 |
| KR | 10-2019-0005354 A | 10/2019 |
| KR | 10-2019-0117985 A | 10/2019 |
| KR | 10-2020-0002968 A | 1/2020 |
| KR | 10-2020-0048286 A | 5/2020 |
| TW | M615416 U | 8/2021 |
| WO | 2021/045275 A1 | 3/2021 |
| WO | 2021/100939 A1 | 5/2021 |

\* cited by examiner

ELECTRONIC DEVICE INCLUDING FINGERPRINT SENSOR

CROSS-REFERENCE TO RELATED APPLICATION(S)

This application is a continuation application, claiming priority under § 365(c), of an International application No. PCT/KR2022/012523, filed on Aug. 22, 2022, which is based on and claims the benefit of a Korean patent application number 10-2021-0133275, filed on Oct. 7, 2021, in the Korean Intellectual Property Office, the disclosure of which is incorporated by reference herein in its entirety.

TECHNICAL FIELD

The disclosure relates to an electronic device including a fingerprint sensor.

BACKGROUND ART

An electronic device is advancing to various forms to secure an extended display area without interfering with portability. For example, the electronic device may have a slide type structure in which a first housing and a second housing are unfolded in a sliding manner with respect to each other if they are used in an overlapping position. The electronic device having the slide type structure may be implemented in various types (e.g., a rollable type or a slidable type) to extend the display area viewed to outside by use of a flexible display.

The electronic device includes an authentication function which uses biometric information such as a user's fingerprint as means for financial transactions or personal authentication. The electronic device includes an in-display type fingerprint sensor disposed on a rear surface of the display to recognize the user's fingerprint in a screen area of a front display.

The above information is presented as background information only to assist with an understanding of the disclosure. No determination has been made, and no assertion is made, as to whether any of the above might be applicable as prior art with regard to the disclosure.

DISCLOSURE

Technical Problem

A bar-type electronic device does not change a display screen area viewed to outside, but if a rollable or a slidable-type electronic device is used, the whole area or a considerable portion of a flexible display may physically change depending on a usage state. Hence, if an in-display type fingerprint sensor is applied to a rollable or slidable type electronic device, a position of the fingerprint sensor disposed on a rear surface of a flexible display may change depending on the usage state of the rollable or slidable electronic device.

In this case, a position of an area for recognizing a user's fingerprint may change depending on the usage state of the rollable or slidable electronic device to thus deteriorate user's usability.

Aspects of the disclosure are to address at least the above-mentioned problems and/or disadvantages and to provide at least the advantages described below. Accordingly, an aspect of the disclosure is to provide to an electronic device including a fingerprint sensor.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a housing which includes a first housing forming a side surface and a rear surface of the electronic device and a second housing connected to the first housing to slide within a designated range, a flexible display viewable in at least one area to an exterior of the electronic device through a front surface of the electronic device, and including a display panel and a reinforcing sheet, wherein the flexible display further comprises a first portion exposed to the exterior of the housing and a second portion extended from the first portion, and drawn in or out of the housing as the second housing moves with respect to the first housing, a circuit board disposed inside the first housing, and a fingerprint sensor spaced from a rear surface of the flexible display, and disposed on the circuit board, wherein the reinforcing sheet includes a first opening area disposed between the fingerprint sensor and the display panel with the second portion drawn in and a second opening area disposed between the fingerprint sensor and the display panel with the second portion drawn out.

In accordance with another aspect of the disclosure, an electronic device is provided. The electronic device includes a housing comprising a first housing forming a side surface and a rear surface of the electronic device and a second housing connected to the first housing to slide within a designated range, a flexible display viewable in at least one area to an exterior of the electronic device through a front surface of the electronic device, and including a display panel and a reinforcing sheet, wherein the flexible display includes a first portion exposed to the exterior of the housing and a second portion extended from the first portion, and drawn in or out of the housing as the second housing moves with respect to the first housing, a circuit board disposed inside the first housing, and a fingerprint sensor spaced from a rear surface of the flexible display, and disposed on the circuit board, and the reinforcing sheet may be disposed between the display panel and the fingerprint sensor, and wherein the reinforcing sheet includes a slit area corresponding to an area where the fingerprint sensor is disposed as the second housing moves.

Advantageous Effects

According to various embodiments disclosed in this document, user's convenience may be increased by fixing an area for recognizing a user's fingerprint in a display screen area regardless of a usage state of a rollable or slidable electronic device.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more such surfaces.

Various embodiments of the disclosure to be described may be applied to any electronic device which may change a size of a screen area. Embodiments described herein shall explain, as an example of the electronic device, an electronic device including a flexible display in which the flexible display is rolled in or rolled out by a roller in a horizontal direction from inside of the electronic device. Various embodiments of the disclosure to be described are not limited thereto, and may be applied to an electronic device including a flexible display which is rolled in or rolled out in a vertical direction.

Figure 1:
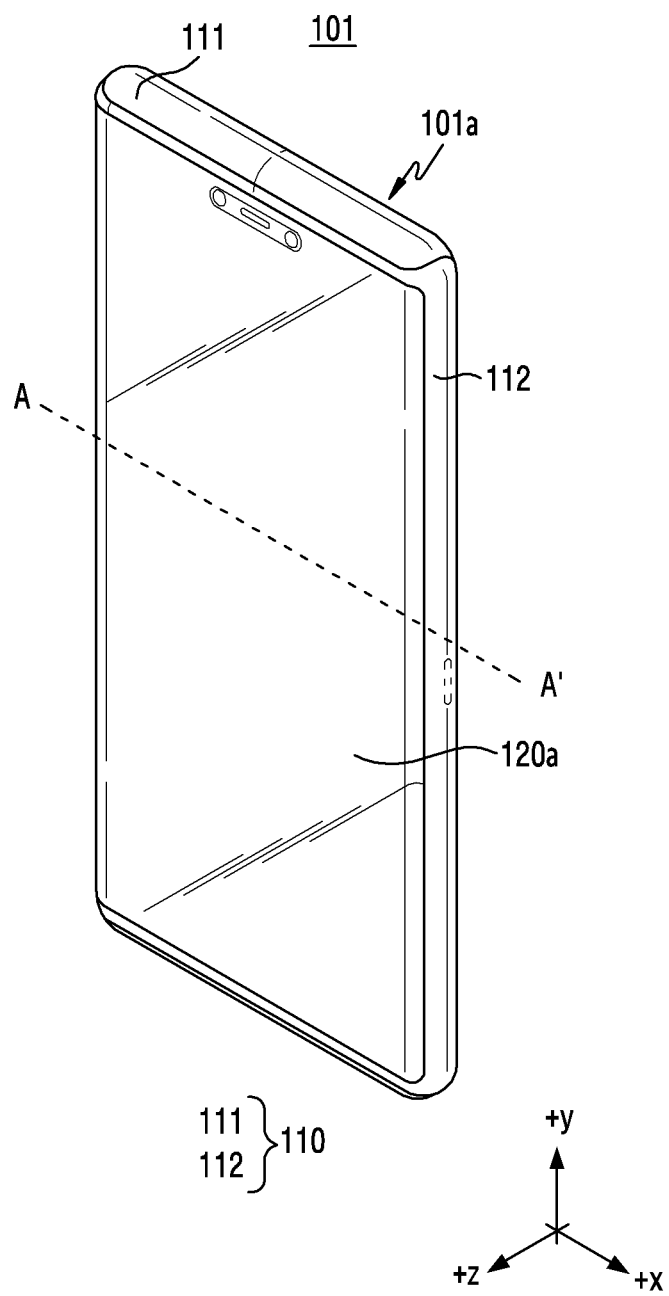
FIG. 1 is a front perspective view showing an electronic device of a first state (e.g., a retracted state), according to an embodiment of the disclosure.

FIG. 1 is a front perspective view showing an electronic device in a first state (e.g., a retracted state), according to an embodiment of the disclosure.

Figure 2:
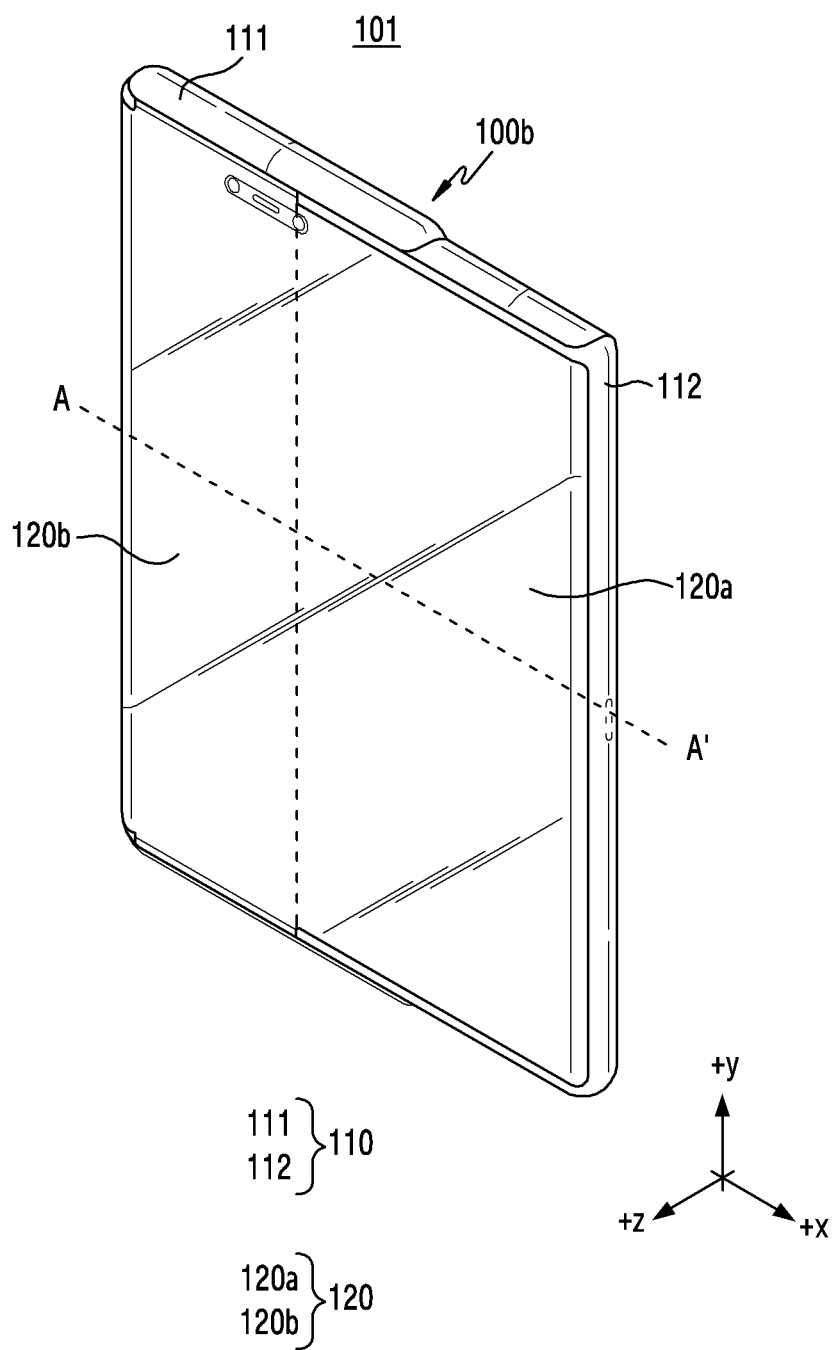
FIG. 2 is a front perspective view showing an electronic device of a second state (e.g., an extended state), according to an embodiment of the disclosure.

FIG. 2 is a front perspective view showing an electronic device in a second state (e.g., an extended state), according to an embodiment of the disclosure.

Referring to FIGS. 1 and 2, a surface facing substantially the same direction as a direction of at least a part (e.g., a first portion 120a) of a flexible display 120 positioned outside the electronic device 101 may be defined as a front surface of the electronic device 101, and a surface facing away from the front surface may be defined as a rear surface of the electronic device 101. A surface surrounding a space between the front surface and the rear surface may be defined as a side surface of the electronic device 101.

The flexible display 120 may be disposed in at least a part of the electronic device 101. The flexible display 120 may be disposed to include a flat form at least in part and a curved form at least in part. The front surface of the electronic device 101 may include the flexible display 120, and a slidable housing 110 which surrounds at least a part of edges of the flexible display 120.

According to an embodiment of the disclosure, the slidable housing 110 may form a partial area of the front surface (e.g., a surface of the electronic device 101 facing the +z direction of FIG. 1 and FIG. 2), the rear surface (e.g., a surface of the electronic device 101 facing the −z direction of FIG. 1 and FIG. 2) and the side surface (e.g., a surface interconnecting the front surface and the rear surface of the electronic device 101) of the electronic device 101. According to another embodiment, the slidable housing 110 may form a partial area of the side surface and the rear surface of the electronic device 101.

The slidable housing 110 may include a first housing 111 and a second housing 112 coupled to move within a specific range with respect to the first housing 111.

The flexible display 120 may include a first portion 120a coupled to the second housing 112, and a second portion 120b extended from the first portion 120a and drawn into the electronic device 101.

The electronic device 101 may operation in one of the first state 101a and the second state 101b. For example, the first state 101a and the second state 101b of the electronic device 101 may be determined by a relative position of the second housing 112 with respect to the slidable housing 110, and the electronic device 101 may be configured to switch between the first state 101a and the second state 101b according to a user's manipulation or a mechanical operation.

The first state 101a of the electronic device 101 may indicate a state before the slidable housing 110 is extended. The second state 101b of the electronic device 101 may indicate a state in which the slidable housing 110 is extended.

If the electronic device 101 switches from the first state 101a to the second state 101b according to a movement of the second housing 112, the second portion 120b of the flexible display 120 may be drawn (or exposed) from the inside of the electronic device 101 to the outside. In various embodiments, drawing (or exposing) the flexible display 120 may indicate that it is viewable from the outside of the electronic device 101. If the electronic device 101 switches from the second state 101b to the first state 101a according to a movement of the second housing 112, the second portion 120b of the flexible display 120 may be drawn into the electronic device 101. Drawing in the flexible display 120 may indicate that is not viewable from the outside of the electronic device.

Figure 3A:
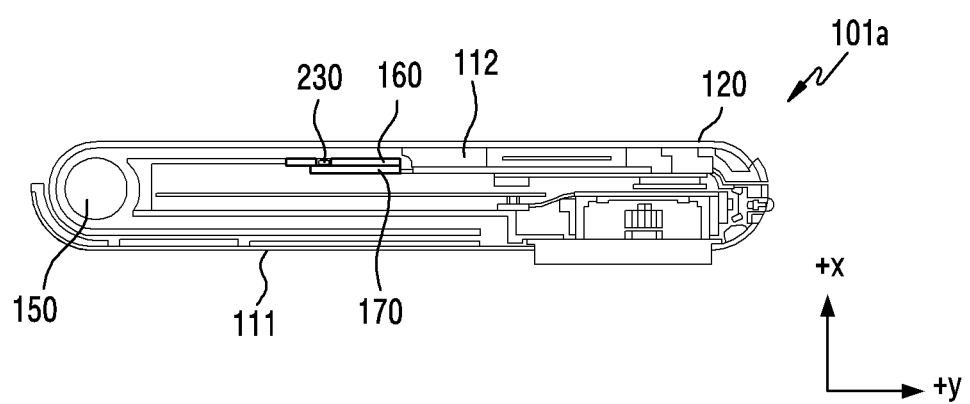
FIG. 3A illustrates a cross sectional view of A-A' of an electronic device 101 in a first state, according to an embodiment of the disclosure.
Figure 3B:
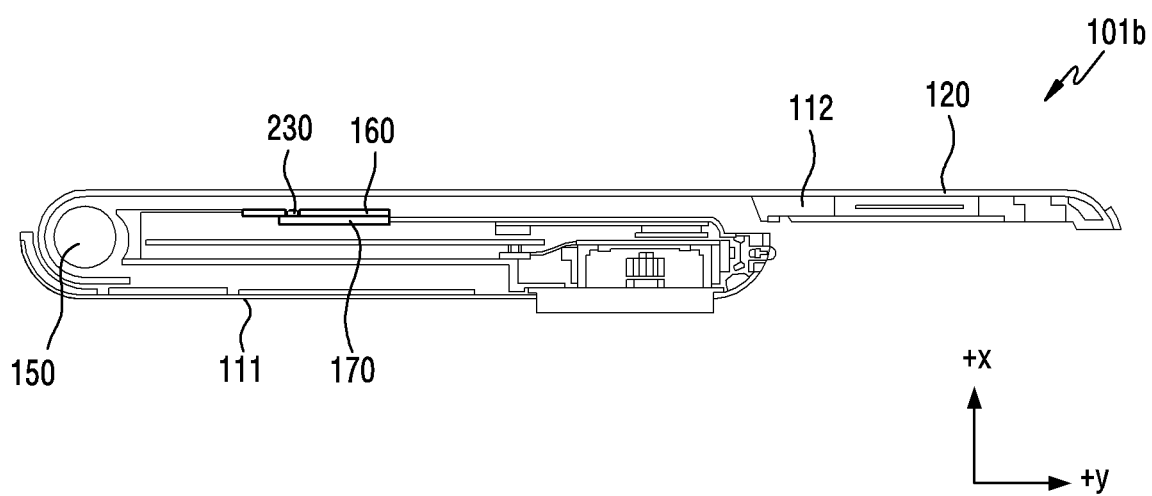
FIG. 3B illustrates the cross sectional view of A-A' of the electronic device in a second state, according to an embodiment of the disclosure.

FIG. 3A illustrates a cross sectional view of A-A' of an electronic device 101 in a first state, according to an embodiment of the disclosure. FIG. 3B illustrates the cross sectional view of A-A' of the electronic device 101 of a second state, according to an embodiment of the disclosure.

Referring to FIGS. 3A and 3B, the electronic device 101 may include a flexible display 120, a first housing 111, a second housing 112, a roller 150, a metal plate 160, a circuit board 170, and/or a fingerprint sensor 230.

The flexible display 120 may be adjusted in a width exposed to outside based on a sliding operation of the second housing 112.

Figure 4A:
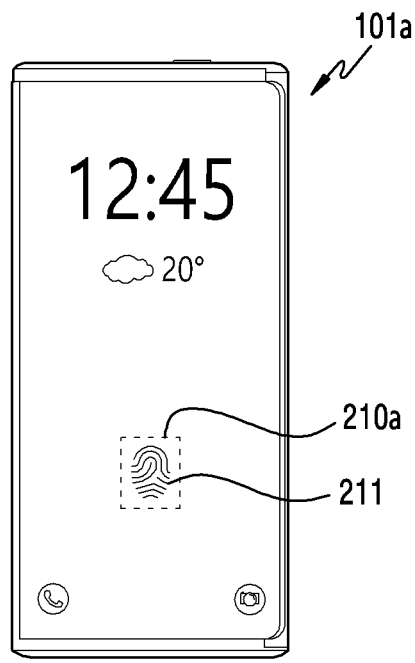
FIG. 4A illustrates arrangement of a flexible display and a fingerprint sensor of a first state, according to an embodiment of the disclosure.
Figure 4A:
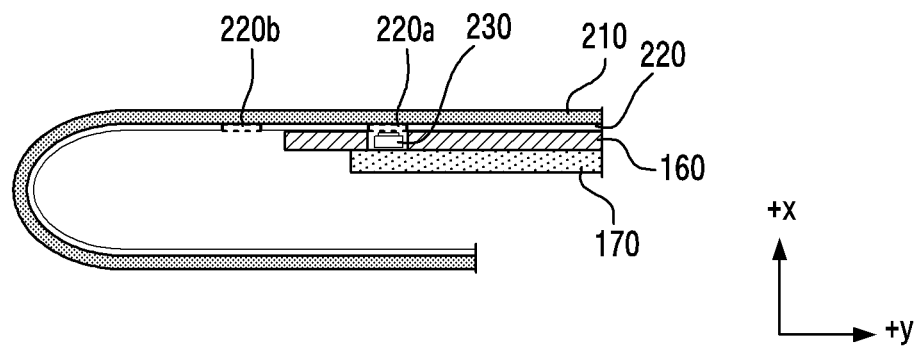

The flexible display 120 may include a display panel (e.g., a display panel 210 of FIG. 4A) and a reinforcing sheet (e.g., a reinforcing sheet 220 of FIG. 4A).

The flexible display 120 may include the display panel (e.g., the display panel 210 of FIG. 4A) and a control circuit (not shown). For example, the flexible display 120 may include an active matrix organic light emitting diode (AMO-LED) display, or a passive matrix organic light emitting diode (PMOLED) display, but is not limited thereto. In an embodiment, the display panel 210 may be a flexible display panel (e.g., an OLED panel).

The roller 150 may be connected with the second housing 112 to slide the second housing 112. For example, the roller 150 may be provided in a bar shape and perform a rotational motion, although other shapes are possible.

Referring to FIG. 3A, if the roller 150 rotates in a first rotation direction (e.g., counterclockwise), the flexible display 120 may be rolled into the electronic device 101 along an outer circumferential surface of the roller 150, and accordingly a display area of the flexible display 120 exposed to the outside may be reduced.

Referring to FIG. 3B, if the roller 150 rotates in a second rotation direction (e.g., clockwise), the flexible display 120 may be spread out of the electronic device 101 along the outer circumferential surface of the roller 150, and accordingly the display area of the flexible display 120 exposed may be extended.

The circuit board 170 may be disposed in at least one area inside the electronic device 101. In an example, the circuit board 170 may be disposed inside the first housing 111.

The metal plate 160 may support at least one portion of the flexible display 120. The fingerprint sensor 230 may be disposed in at least one area of the metal plate 160.

The second housing 112 may slide on the metal plate 160 (e.g., +x direction) in a lateral direction (e.g., +y direction). Accordingly, the flexible display 120 coupled onto the second housing 112 may also slide in the lateral direction, to extend or reduce the display area of the flexible display 120 exposed to the outside.

The circuit board 170 may include at least one of a printed circuit board (PCB), or a flexible PCB (FPCB).

The circuit board 170 may include a PCB on which a plurality of electronic components is disposed.

The fingerprint sensor 230 may be disposed on (e.g., +x direction) of the circuit board 170. For example, the fingerprint sensor 230 may be disposed away from a rear surface (e.g., -x direction) of the flexible display 120. In an embodiment, the fingerprint sensor 230 may be connected with the circuit board 170 through a wire. The wire may include an FPBC.

The fingerprint sensor 230 may detect that a light outputted from a plurality of light emitting elements is reflected by the user's fingerprint, detect the reflected light and thus detect the user's fingerprint. In an example, the fingerprint sensor 230 may include an optical fingerprint detection sensor.

FIG. 4A illustrates arrangement of a flexible display and a fingerprint sensor in a first state, according to an embodiment of the disclosure.

Figure 4B:
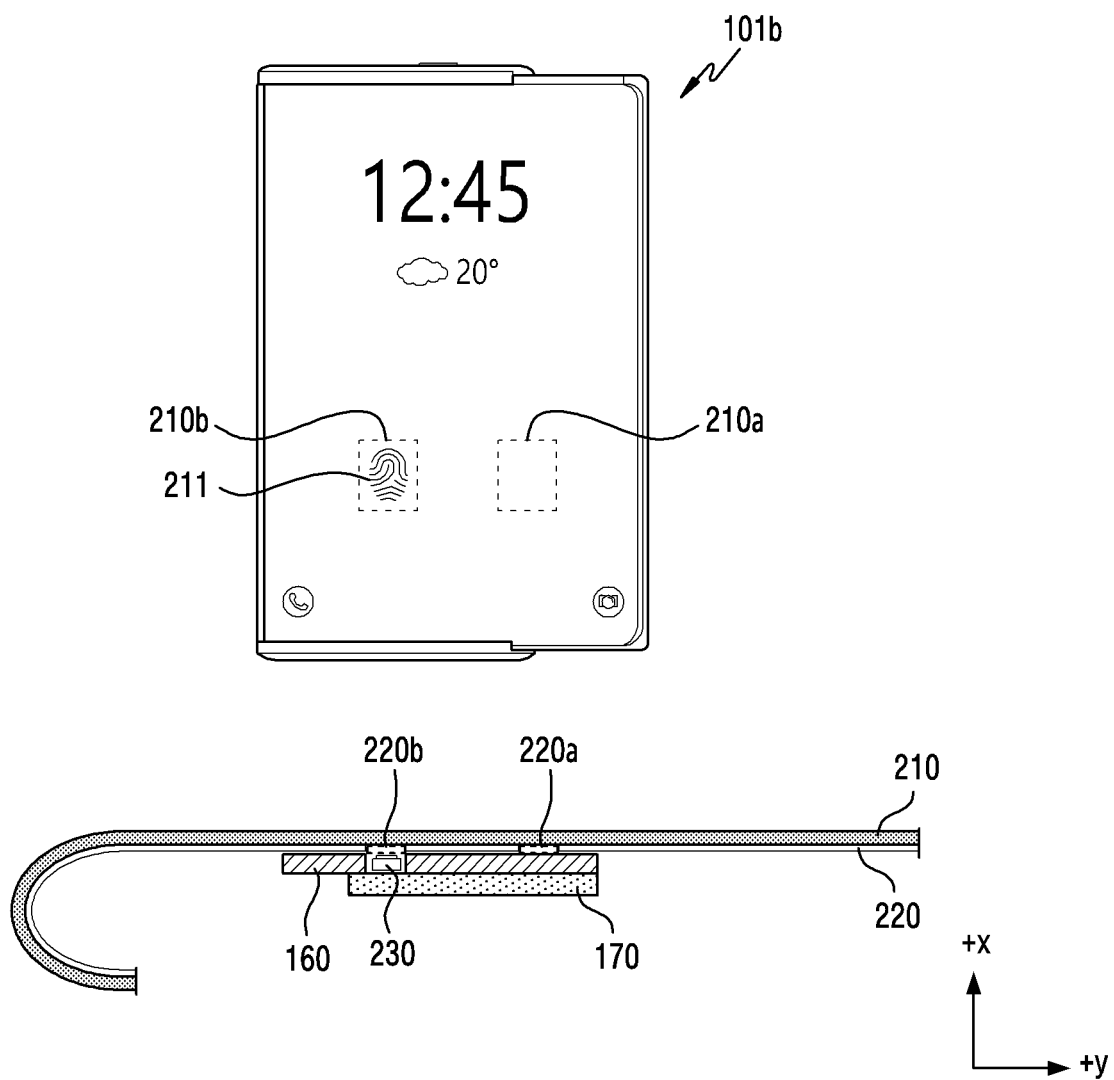
FIG. 4B illustrates arrangement of a flexible display and a fingerprint sensor of a second state, according to an embodiment of the disclosure.

FIG. 4B illustrates arrangement of the flexible display and the fingerprint sensor in a second state, according to an embodiment of the disclosure.

Referring to FIG. 4A, a first fingerprint detection area 220a set in a display panel 210 of an electronic device 101 in the first state 101a and a reinforcing sheet 220 are shown.

Referring to FIG. 4B, a second fingerprint detection area 210b set in the display panel 210 of the electronic device 101 in the second state 101b and the reinforcing sheet 220 are shown.

The flexible display 120 may include the display panel 210 and the reinforcing sheet 220.

The display panel 210 may include a touch screen panel. For example, the display panel 210 may provide the user with an image corresponding to an input signal according to the input signal detected on the touch screen panel.

The reinforcing sheet 220 may include a first opening area 220a and a second opening area 220b.

The reinforcing sheet 220 may include the first opening area 220a positioned between the display panel 210 and the fingerprint sensor 230 in the first state 101a. The reinforcing sheet 220 may include the first opening area 220a positioned between the fingerprint sensor 230 and the display panel 210 with a second portion (e.g., the second portion 120b of FIG. 1) of the flexible display 120 drawn in.

The reinforcing sheet 220 may include the second opening area 220b positioned between the display panel 210 and the fingerprint sensor 230 in the second state 101b. For example, the reinforcing sheet 220 may include the second opening area 220b positioned between the fingerprint sensor 230 and the display panel 210 with the second portion 120b of the flexible display 120 drawn out.

According to an embodiment of the disclosure, The first opening area 220a may be disposed in the first portion 120a of the flexible display 120, and the second opening area 220b may be disposed in the second portion 120b of the flexible display 120. According to another embodiment, the first opening area 220a and the second opening area 220b may be disposed in the first portion 120a of the flexible display 120.

As the display area of the flexible display 120 of the electronic device 101 is extended and switched from the first state 101a to the second state 101b, the fingerprint sensor 230 may be disposed from a lower side (e.g., −x direction) of the first opening area 220a to a lower side (e.g., −x direction) of the second opening area 220b.

The electronic device 101 in the first state 101a may set the first fingerprint detection area 210a for obtaining user's fingerprint information on the display panel 210. For example, the first fingerprint detection area 210a may correspond to the first opening area 220a of the reinforcing sheet 220.

The electronic device 101 in the second state 101b may set the second fingerprint detection area 210b for obtaining user's fingerprint information on the display panel 210. For example, the second fingerprint detection area 210b may include a fingerprint detection area distinguished from the first fingerprint detection area 210a. The second fingerprint detection area 210b may correspond to the second opening area 220b of the reinforcing sheet 220.

The electronic device 101 may detect an external object (e.g., a user's body part) contacting the first fingerprint detection area 210a in the first state 101a. For example, the electronic device 101 in the first state 101a may display a fingerprint recognition object 211 for guiding the fingerprint detection area in the first fingerprint detection area 210a.

The electronic device 101 may detect an external object contacting the second fingerprint detection area 210b in the second state 101b. For example, the electronic device 101 in the second state 101b may display the fingerprint recognition object 211 for guiding the fingerprint detection area in the second fingerprint detection area 210b.

The 'opening area' may be referred to as a 'slit area'.

Figure 5:
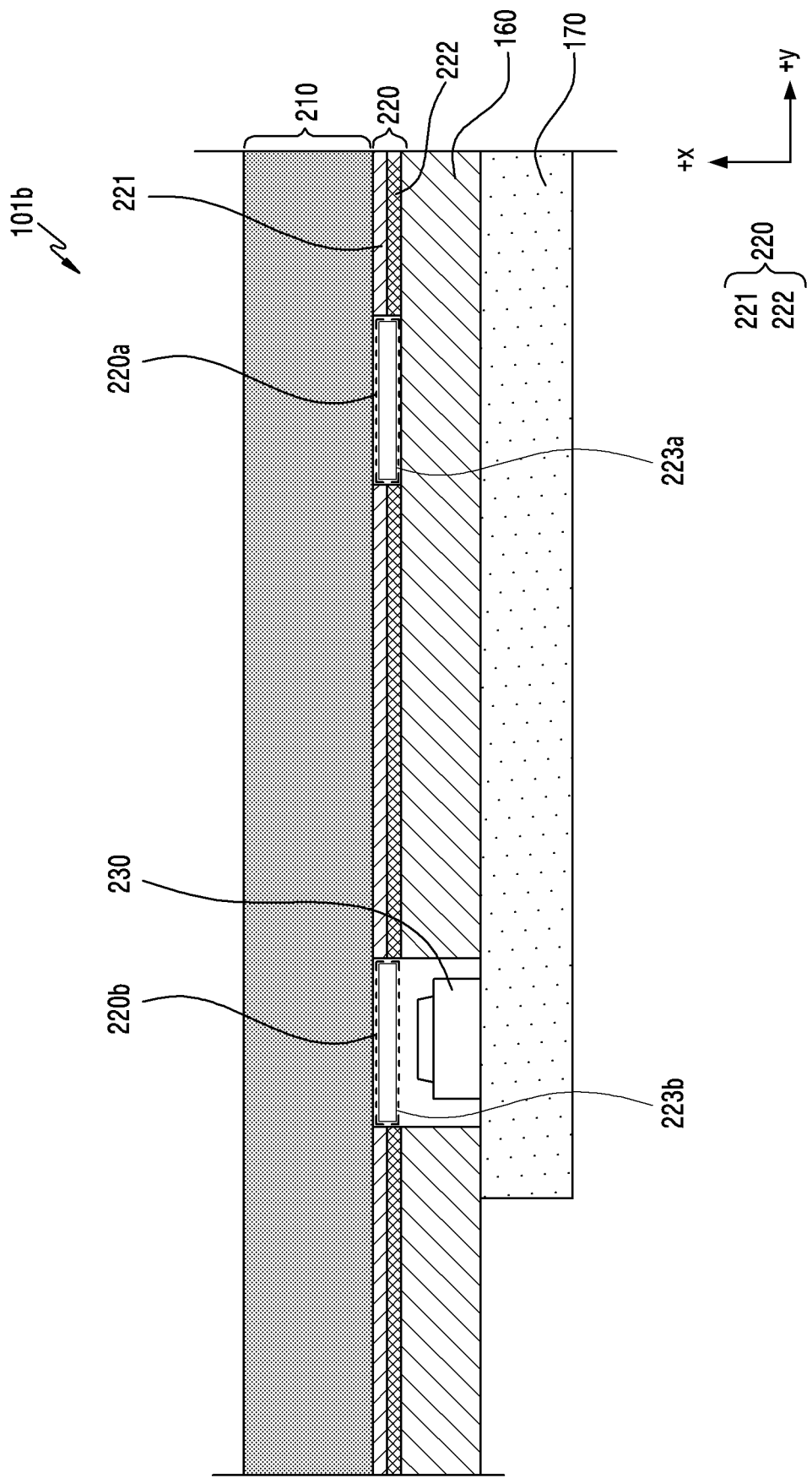
FIG. 5 illustrates arrangement of a flexible display and a fingerprint sensor of a second state, according to an embodiment of the disclosure.

FIG. 5 illustrates arrangement of a flexible display and a fingerprint sensor in a second state, according to an embodiment of the disclosure.

Referring to FIG. 5, a reinforcing sheet 220 may include at least one of a shielding sheet 221 or a cushion member 222.

The shielding sheet 221 may be formed with a material for shielding electromagnetism. For example, the shielding sheet 221 may include a copper (Cu) plate.

The cushion member 222 may be formed with a material for mitigating impact onto the display panel 210. For example, the cushion member 222 may be attached to a rear surface (e.g., −x direction) of the display panel 210, and the shielding sheet 221 may be attached to a rear surface (e.g., −x direction) of the cushion member 222.

The reinforcing sheet 220 may include a transparent optical film for compensation of strength and thickness in the first opening area 210a and the second opening area 220b. For example, a transmittance of the transparent optical film may include about 89% through 93%.

The reinforcing sheet 220 may include a first transparent optical film 223a in the first opening area 210a. The reinforcing sheet 220 may include a second transparent optical film 223b in the second opening area 220b.

Figure 6A:
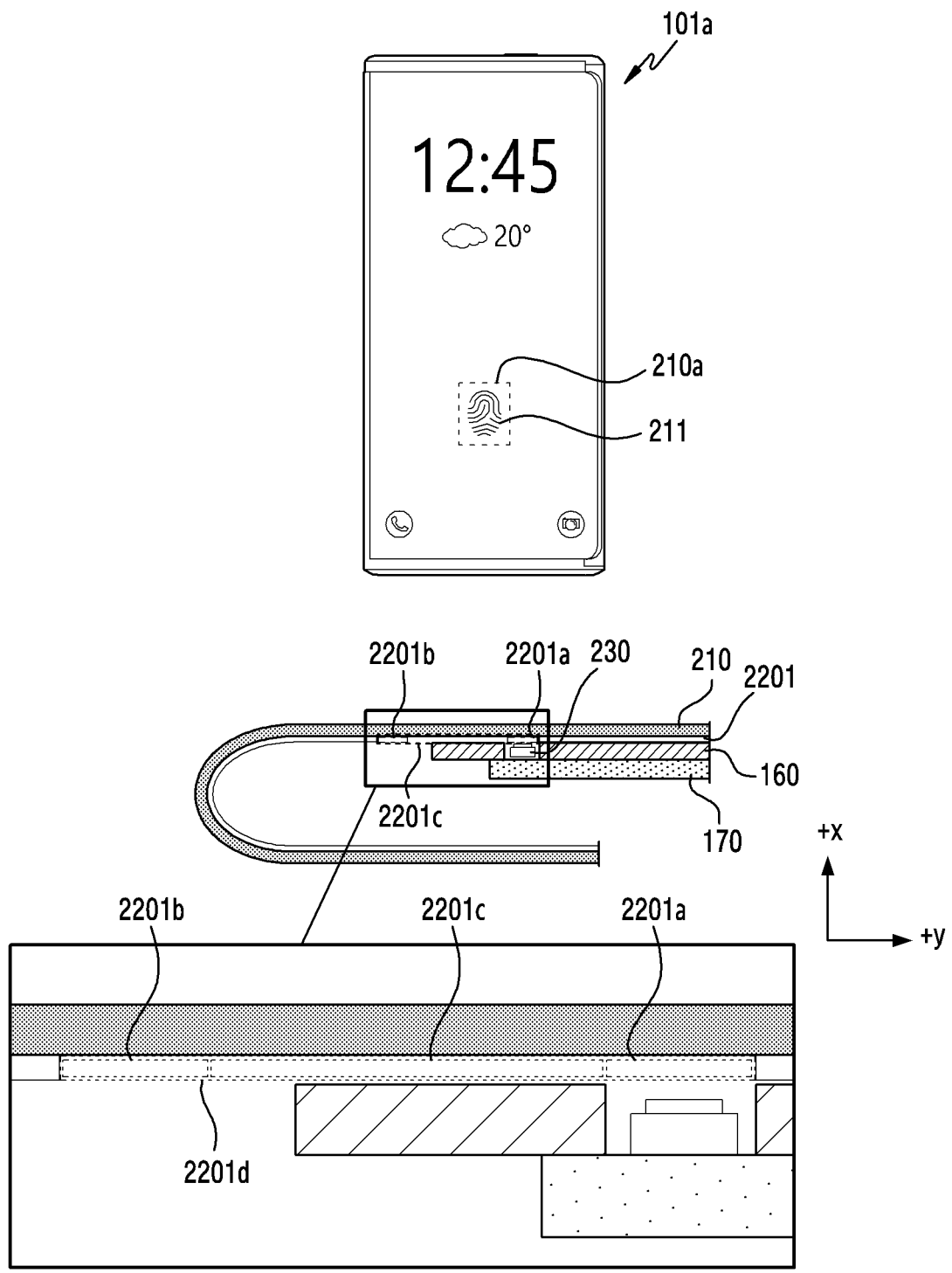
FIG. 6A illustrates arrangement of a flexible display and a fingerprint sensor of a first state, according to an embodiment of the disclosure.

FIG. 6A illustrates arrangement of a flexible display and a fingerprint sensor in a first state, according to an embodiment of the disclosure.

Figure 6B:
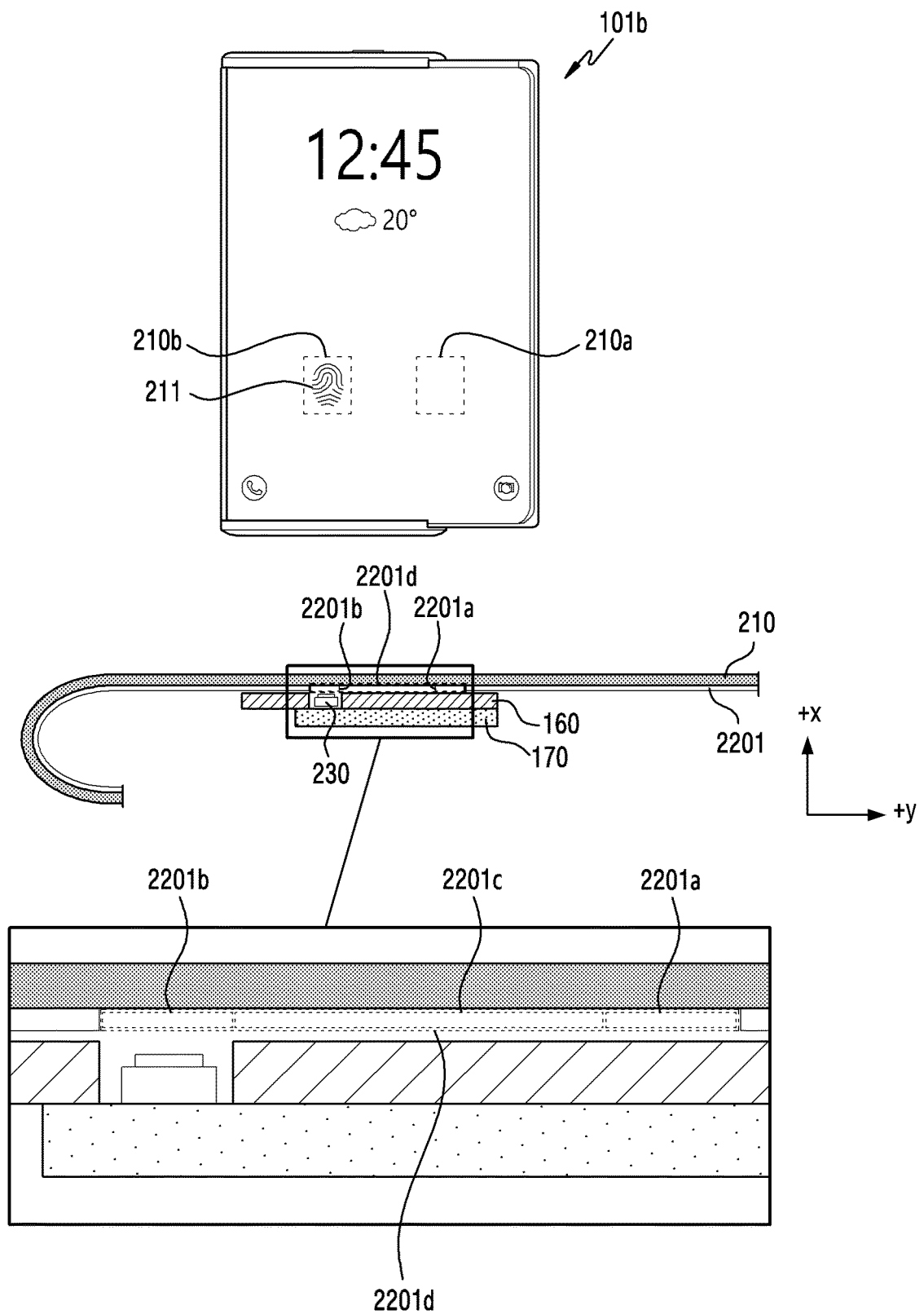
FIG. 6B illustrates arrangement of a flexible display and a fingerprint sensor of a second state, according to an embodiment of the disclosure.

FIG. 6B illustrates arrangement of the flexible display and the fingerprint sensor in a second state, according to an embodiment of the disclosure.

Figure 6C:
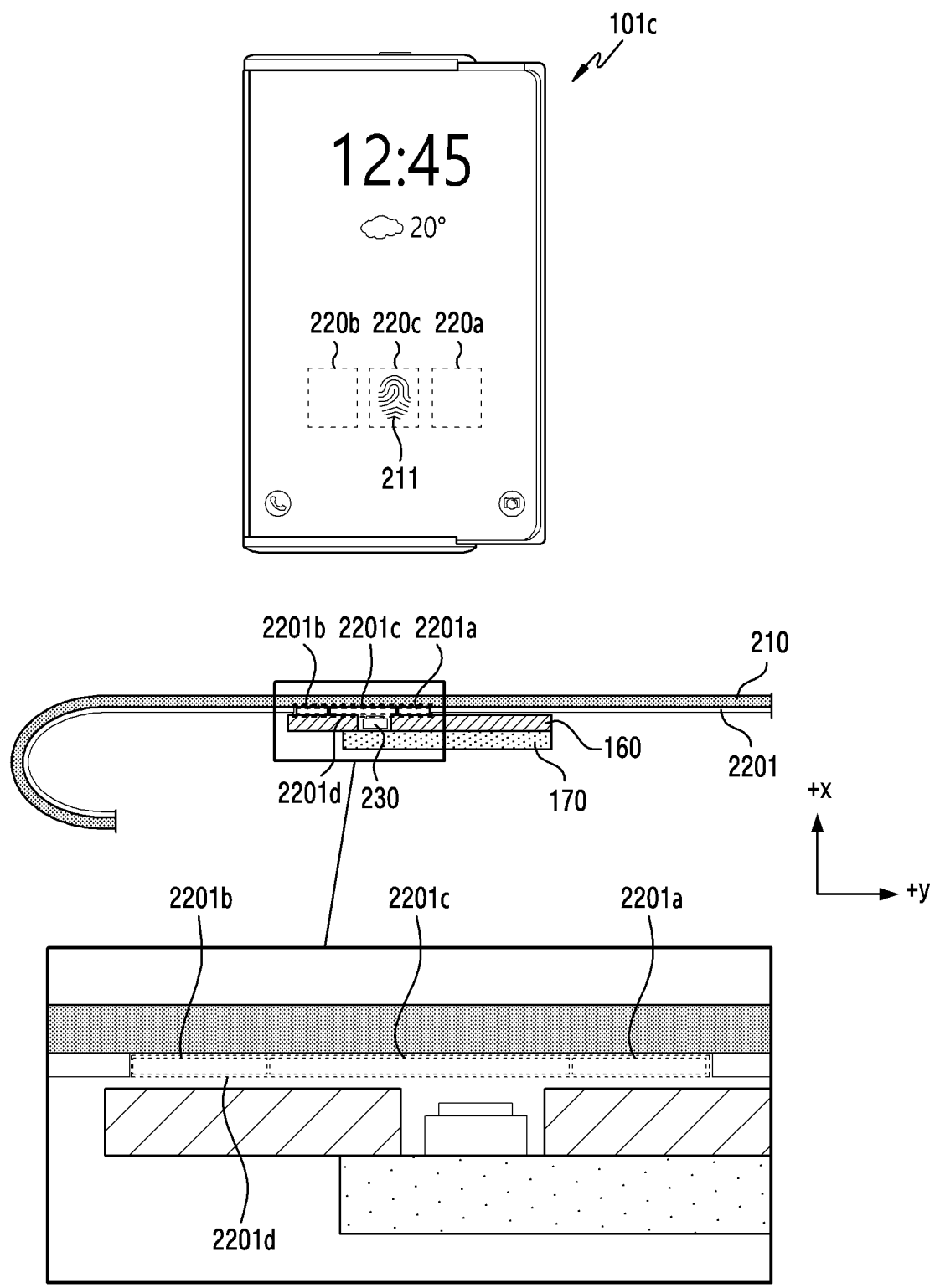
FIG. 6C illustrates arrangement of a flexible display and a fingerprint sensor of an intermediate state, according to an embodiment of the disclosure.

FIG. 6C illustrates arrangement of the flexible display and the fingerprint sensor in an intermediate state, according to an embodiment of the disclosure.

Referring to FIG. 6A, a first fingerprint detection area 210a set in the display panel 210 of an electronic device 101 in the first state 101a and a reinforcing sheet 2201 are shown.

Referring to FIG. 6B, a second fingerprint detection area 210b set in the display panel 210 of the electronic device 101 in the second state 101b and the reinforcing sheet 2201 are shown.

Referring to FIG. 6C, a third fingerprint detection area 210c set in the display panel 210 of the electronic device 101 in the intermediate state 101c between the first state 101a and the second state 101b and the reinforcing sheet 2201 are shown.

Referring to FIG. 6A, the reinforcing sheet 2201 may include an opening area 2201d including a first opening area 2201a, a second opening area 2201b, and an intermediate opening area 2201c. In an example, the intermediate opening area 2201c may include an opening area which interconnects the first opening area 2201a and the second opening area 2201b.

The reinforcing sheet 2201 may include a first opening area 2201a, a second opening area 2201b and an intermediate opening area 2201c, and may include an opening area 2201d interposed between the display panel 210 and the fingerprint sensor 230 on a movement path of the flexible display 120 built as a second housing (e.g., the second housing 112 of FIG. 1) moves in the first state 101a.

The opening area 2201d may include the first opening area 2201a positioned between the display panel 210 and the fingerprint sensor 230 in the first state 101a.

The opening area 2201d may include the second opening area 2201b positioned between the display panel 210 and the fingerprint sensor 230 in the second state 101b.

The opening area 2201d may include the intermediate opening area 2201c positioned between the display panel 210 and the fingerprint sensor 230 in switching from the first state 101a to the second state 101b as the second housing 112 moves.

The electronic device 101 in the intermediate state 101c between the first state 101a and the second state 101b may set a third fingerprint detection area 210c for obtaining user's fingerprint information on the display panel 210. For example, the third fingerprint detection area 210c may include a fingerprint detection area distinguished from the first fingerprint detection area 210a and the second fingerprint detection area 210b. In an example, the third fingerprint detection area 210c may correspond to the intermediate opening area 2201d.

According to an embodiment of the disclosure, the opening area 2201c may be disposed in a first portion 120a of the flexible display 120. According to another embodiment, at least a part of the opening area 2201c may be disposed in a second portion 120b of the flexible display 120.

The electronic device 101 may detect an external object (e.g., a user's body part) contacting the third fingerprint detection area 210c in the intermediate state 101c between the first state 101a and the second state 101b. For example, the electronic device 101 may display a fingerprint recognition object 211 in the third fingerprint detection area 210c.

A s the display area of the flexible display 120 of the electronic device 101 extends and switches from the first state 101a to the intermediate state 101c, the fingerprint sensor 230 may be disposed from the lower side (e.g., −x direction) of the first opening area 2201*a* to the lower side (e.g., −x direction) of the intermediate opening area 2201*d*.

As the display area of the flexible display 120 extends and switches from the intermediate state 101*c* to the second state 101*b*, the fingerprint sensor 230 may be disposed from the lower side (e.g., −x direction) of the intermediate opening area 2201*c* to the lower side (e.g., −x direction) of the second opening area 2201*b*.

The flexible display 120 disclosed in FIG. 6A may adopt other components than the reinforcing sheet 2201 in the same manner as the components disclosed in FIG. 4A.

Figure 7:
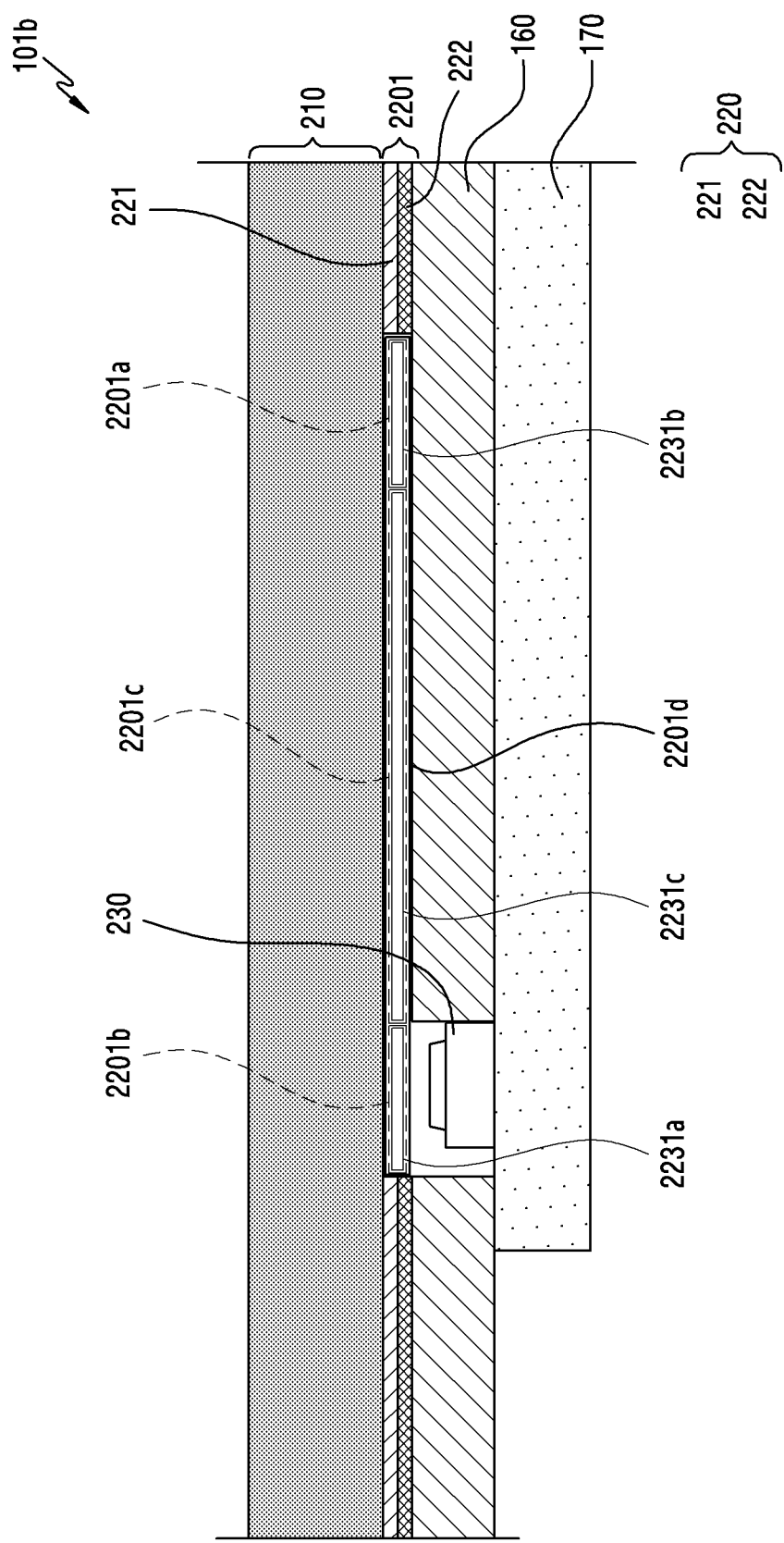
FIG. 7 illustrates a flexible display and a fingerprint sensor of a second state, according to an embodiment of the disclosure.

FIG. 7 illustrates arrangement of a flexible display and a fingerprint sensor in a second state, according to an embodiment of the disclosure.

Referring to FIG. 7, a reinforcing sheet 2201 may include a transparent optical film 2231 for compensation of strength and thickness in a third opening area 2201*c*. For example, the transparent optical film 2231 may include at least one of a first transparent optical film 2231*a*, a second transparent optical film 2231*b*, and a third transparent optical film 2231*c*.

The first transparent optical film 2231*a* may be disposed in a first opening area 2201*a*. The second transparent optical film 2231*b* may be disposed in a second opening area 2201*b*. The third transparent optical film 2231*c* may be disposed in the third opening area 2201*c*.

The first transparent optical film 2231*a*, the second transparent optical film 2231*b* and the third transparent optical film 2231*c* included in the transparent optical film 2231 may be separated and disposed in an opening area 2201*d*, or may be integrally disposed in the opening area 2201*d*.

Figure 8A:
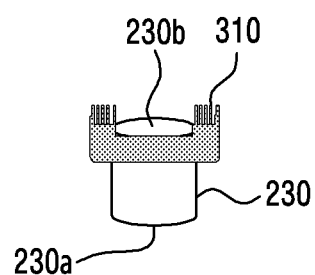
FIGS. 8A and 8B illustrate a fingerprint sensor, according to various embodiments of the disclosure.
Figure 8B:
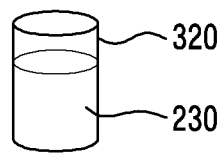

FIGS. 8A and 8B illustrate a fingerprint sensor, according to an embodiment of the disclosure.

Referring to FIG. 8A, the fingerprint sensor 230 may include a first surface 230*a* facing a rear surface (e.g., −x direction of FIG. 4A) of a flexible display 120 and a second surface 230*b* facing away from the first surface 230*a*. A sweeper member 310 may be attached to an area surrounding the fingerprint sensor 230 on the first surface 230*a* of the fingerprint sensor 203. The sweeper member 310 may include nylon fibers.

The sweeper member 310 attached to the fingerprint sensor 230 may remove dust between the display panel 210 and the fingerprint sensor 230 if the flexible display 120 is extended or retracted.

Referring to FIG. 8B, an aperture 320 may be disposed on the first surface 230*a* of the fingerprint sensor 230.

The aperture 320 may control to close the aperture 320, if the fingerprint sensor 230 is deactivated. The aperture 320 may control to open the aperture 320 if the fingerprint sensor 230 is activated. Its related operations shall be explained in detail by referring to FIG. 11.

Figure 9:
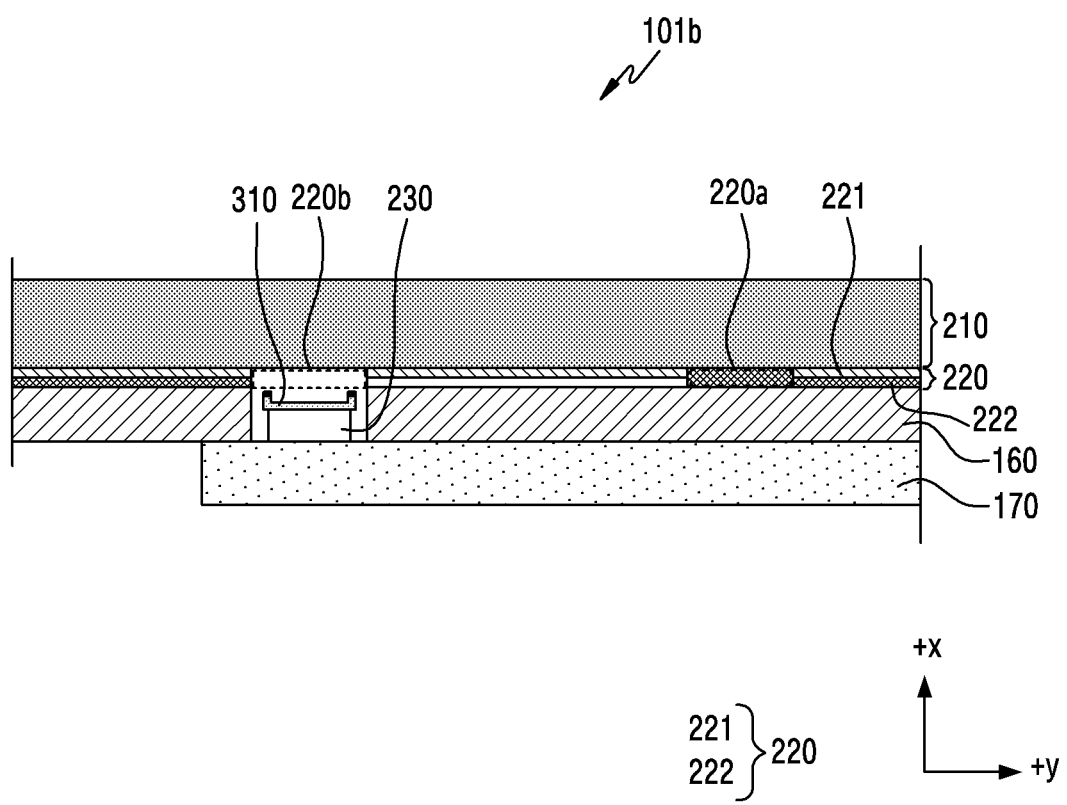
FIG. 9 illustrates a flexible display of a second state and a fingerprint sensor including a sweeper, according to an embodiment of the disclosure.

FIG. 9 illustrates a flexible display of a second state and a fingerprint sensor including a sweeper member, according to an embodiment of the disclosure.

Referring to FIG. 9, the sweeper member 310 may be disposed on (e.g., +x direction) of the fingerprint sensor 230. The sweeper member 310 may be disposed to surround the fingerprint sensor 230. If the flexible display 120 moves, dust around the flexible display 120 may be removed through the sweeper member 310 disposed on the fingerprint sensor 230. For example, the sweeper member 310 disposed on the fingerprint sensor 230 may be disposed between the fingerprint sensor 230 and the flexible display 120 to block foreign substances entering a space between the fingerprint sensor 230 and the flexible display 120.

Figure 10A:
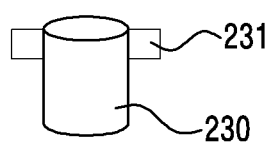
FIGS. 10A, 10B, and 10C illustrate a fingerprint sensor and a guide member, according to various embodiments of the disclosure.
Figure 10B:
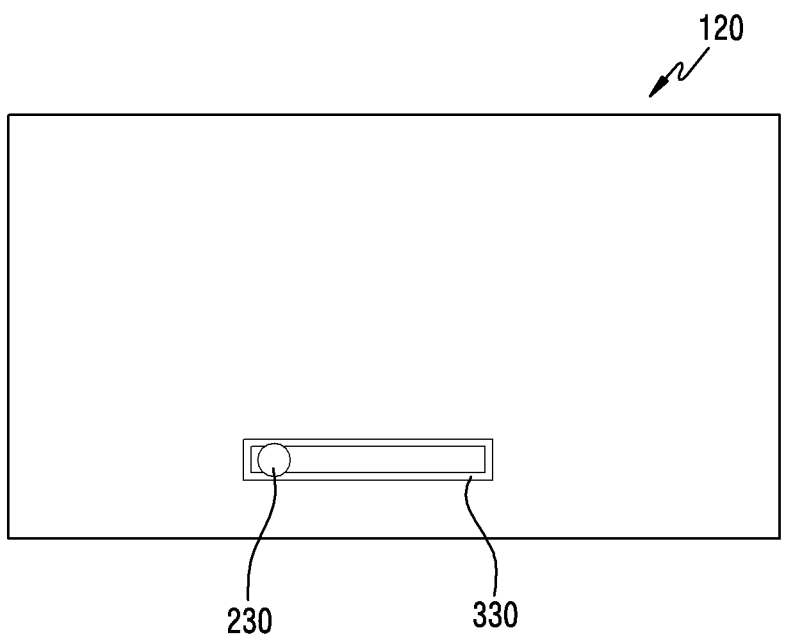
Figure 10C:
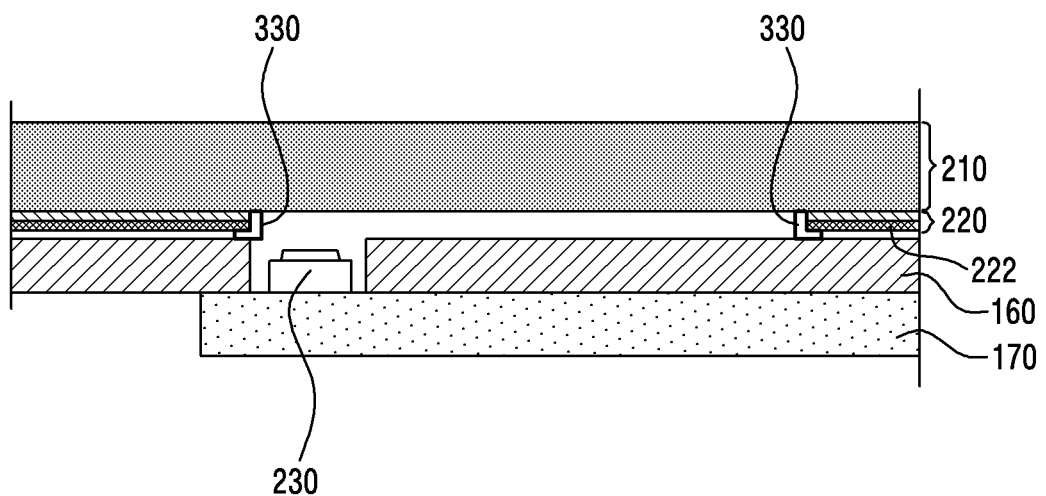

FIGS. 10A-10C illustrate a fingerprint sensor and a guide member, according to various embodiments of the disclosure.

Referring to FIGS. 10A and 10B, the guide member 330 may be disposed in an area surrounding a third opening area (e.g., the third opening area 220*c* of FIG. 6A) included in a reinforcing sheet 220. The guide member 330 may include a receiving portion for connecting with the fingerprint sensor 230.

Referring to FIG. 10C, the fingerprint sensor 230 may include a hook 231 for coupling with the receiving portion of the guide member 330. In an example, the hook 231 may be formed on a side surface of the fingerprint sensor 230.

The flexible display 120 may be extended or retracted based on the fingerprint sensor 230 according to the coupling of the hook 231 of the fingerprint sensor 230 and the receiving portion formed in the guide member 330.

Figure 11:
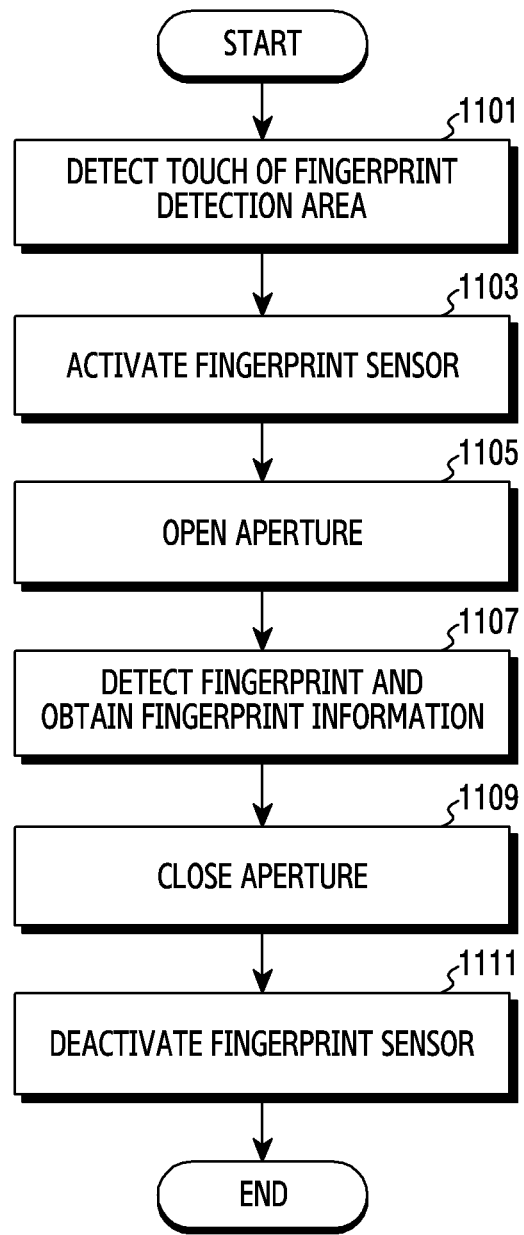
FIG. 11 is a flowchart showing controlling opening and closing of an aperture disposed on a fingerprint sensor, according to an embodiment of the disclosure.

FIG. 11 is a flowchart showing opening and closing of an aperture disposed on a fingerprint sensor, according to an embodiment of the disclosure.

Referring to FIG. 11, an electronic device 101 may detect contact of an external object (e.g., a user's body part) in a fingerprint detection area (e.g., the first fingerprint detection area 210*a*, the second fingerprint detection area 210*b*, or the third fingerprint detection area 210*c*) in operation 1101.

The electronic device 101 may display the fingerprint recognized object in the fingerprint detection area of the display panel 210 in response to a fingerprint recognition event occurrence to receive an operation of receiving fingerprint information.

The electronic device 101 may activate the fingerprint sensor 230 in operation 1103.

The electronic device 101 may open the aperture (e.g., the aperture 320 of FIG. 8B) disposed on the fingerprint sensor 230 in operation 1105.

The electronic device 101 may detect the fingerprint contacting the fingerprint detection area, and obtain fingerprint information through the detected fingerprint, in operation 1107.

The electronic device 101 may close the aperture 320 in operation 1109. Accordingly, it is possible to prevent a foreign substance from placing on an optical lens included in the fingerprint sensor 230 by closing the aperture 320.

The electronic device 101 may deactivate the fingerprint sensor in operation 1111.

Figure 12:
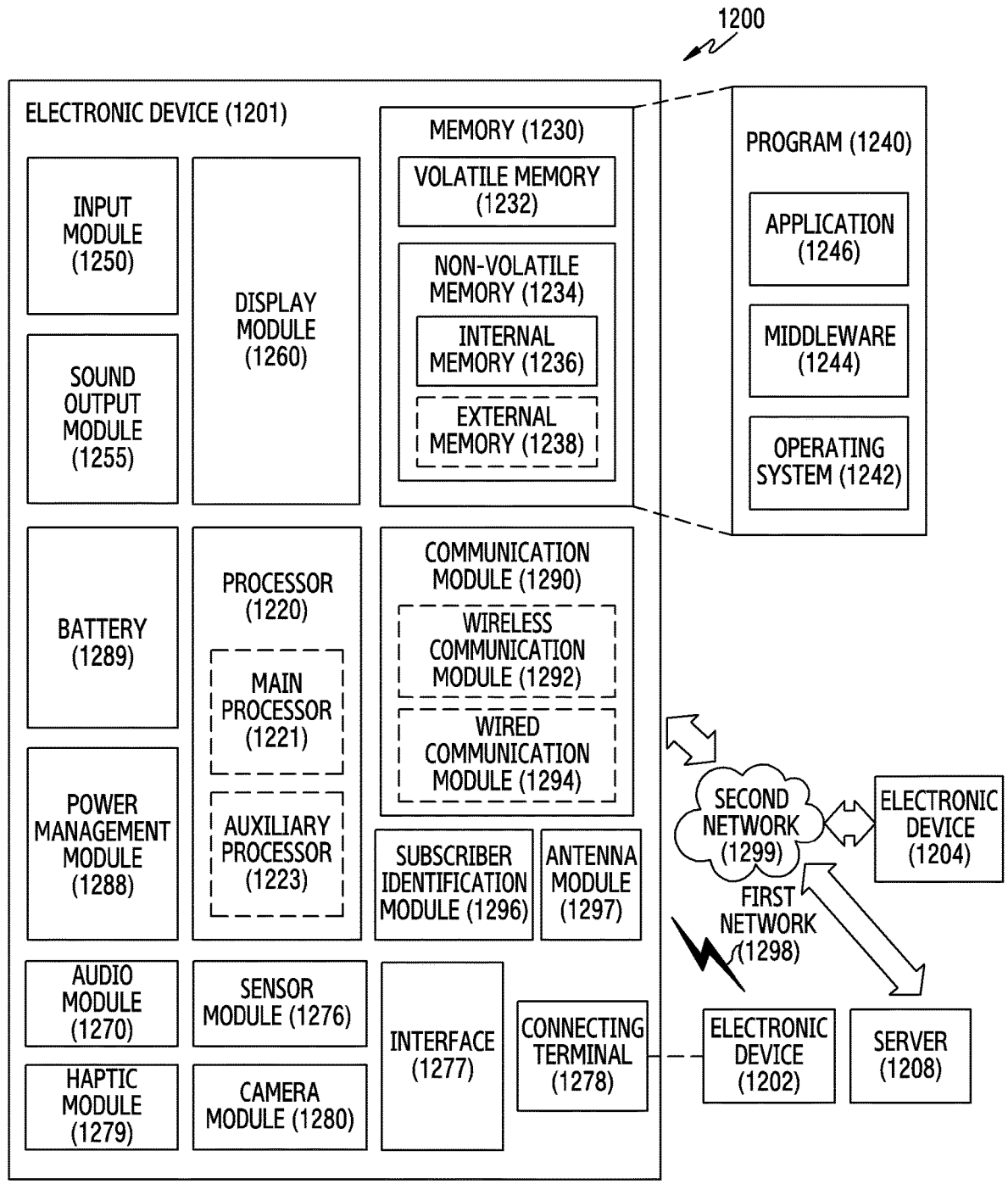
FIG. 12 is a block diagram of an electronic device in a network environment, according to an embodiment of the disclosure.

FIG. 12 is a block diagram of an electronic device in a network environment, according to an embodiment of the disclosure.

Referring to FIG. 12, the electronic device 1201 in the network environment 1200 may communicate with an electronic device 1202 via a first network 1298 (e.g., a short-range wireless communication network), or at least one of an electronic device 1204 or a server 1208 via a second network 1299 (e.g., a long-range wireless communication network). According to an embodiment, the electronic device 1201 may communicate with the electronic device 1204 via the server 1208. According to an embodiment, the electronic device 1201 may include a processor 1220, memory 1230, an input module 1250, a sound output module 1255, a display module 1260, an audio module 1270, a sensor module 1276, an interface 1277, a connecting terminal 1278, a haptic module 1279, a camera module 1280, a power management module 1288, a battery 1289, a communication module 1290, a subscriber identification module (SIM) 1296, or an antenna module 1297. In some embodiments, at least one of the components (e.g., the connecting terminal 1278) may be omitted from the electronic device 1201, or one or more other components may be added in the electronic device 1201. In some embodiments, some of the components (e.g., the sensor module 1276, the camera module 1280, or the antenna module 1297) may be implemented as a single component (e.g., the display module 1260).

The processor 1220 may execute, for example, software (e.g., a program 1240) to control at least one other component (e.g., a hardware or software component) of the electronic device 1201 coupled with the processor 1220, and may perform various data processing or computation. According to one embodiment, as at least part of the data processing or computation, the processor 1220 may store a command or data received from another component (e.g., the sensor module 1276 or the communication module 1290) in volatile memory 1232, process the command or the data stored in the volatile memory 1232, and store resulting data in non-volatile memory 1234. According to an embodiment, the processor 1220 may include a main processor 1221 (e.g., a central processing unit (CPU) or an application processor (AP)), or an auxiliary processor 1223 (e.g., a graphics processing unit (GPU), a neural processing unit (NPU), an image signal processor (ISP), a sensor hub processor, or a communication processor (CP)) that is operable independently from, or in conjunction with, the main processor 1221. For example, when the electronic device 1201 includes the main processor 1221 and the auxiliary processor 1223, the auxiliary processor 1223 may be adapted to consume less power than the main processor 1221, or to be specific to a specified function. The auxiliary processor 1223 may be implemented as separate from, or as part of the main processor 1221.

The auxiliary processor 1223 may control at least some of functions or states related to at least one component (e.g., the display module 1260, the sensor module 1276, or the communication module 1290) among the components of the electronic device 1201, instead of the main processor 1221 while the main processor 1221 is in an inactive (e.g., sleep) state, or together with the main processor 1221 while the main processor 1221 is in an active state (e.g., executing an application). According to an embodiment, the auxiliary processor 1223 (e.g., an image signal processor or a communication processor) may be implemented as part of another component (e.g., the camera module 1280 or the communication module 1290) functionally related to the auxiliary processor 1223. According to an embodiment, the auxiliary processor 1223 (e.g., the neural processing unit) may include a hardware structure specified for artificial intelligence model processing. An artificial intelligence model may be generated by machine learning. Such learning may be performed, e.g., by the electronic device 1201 where the artificial intelligence is performed or via a separate server (e.g., the server 1208). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1230 may store various data used by at least one component (e.g., the processor 1220 or the sensor module 1276) of the electronic device 1201. The various data may include, for example, software (e.g., the program 1240) and input data or output data for a command related thereto. The memory 1230 may include the volatile memory 1232 or the non-volatile memory 1234.

The program 1240 may be stored in the memory 1230 as software, and may include, for example, an operating system (OS) 1242, middleware 1244, or an application 1246.

The input module 1250 may receive a command or data to be used by another component (e.g., the processor 1220) of the electronic device 1201, from the outside (e.g., a user) of the electronic device 1201. The input module 1250 may include, for example, a microphone, a mouse, a keyboard, a key (e.g., a button), or a digital pen (e.g., a stylus pen).

The sound output module 1255 may output sound signals to the outside of the electronic device 1201. The sound output module 1255 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1260 may visually provide information to the outside (e.g., a user) of the electronic device 1201. The display module 1260 may include, for example, a display, a hologram device, or a projector and control circuitry to control a corresponding one of the display, hologram device, and projector. According to an embodiment, the display module 1260 may include a touch sensor adapted to detect a touch, or a pressure sensor adapted to measure the intensity of force incurred by the touch.

The audio module 1270 may convert a sound into an electrical signal and vice versa. According to an embodiment, the audio module 1270 may obtain the sound via the input module 1250, or output the sound via the sound output module 1255 or a headphone of an external electronic device (e.g., an electronic device 1202) directly (e.g., wiredly) or wirelessly coupled with the electronic device 1201.

The sensor module 1276 may detect an operational state (e.g., power or temperature) of the electronic device 1201 or an environmental state (e.g., a state of a user) external to the electronic device 1201, and then generate an electrical signal or data value corresponding to the detected state. According to an embodiment, the sensor module 1276 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1277 may support one or more specified protocols to be used for the electronic device 1201 to be coupled with the external electronic device (e.g., the electronic device 1202) directly (e.g., wiredly) or wirelessly. According to an embodiment, the interface 1277 may include, for example, a high definition multimedia interface (HDMI), a universal serial bus (USB) interface, a secure digital (SD) card interface, or an audio interface.

A connecting terminal 1278 may include a connector via which the electronic device 1201 may be physically connected with the external electronic device (e.g., the electronic device 1202). According to an embodiment, the connecting terminal 1278 may include, for example, a HDMI connector, a USB connector, an SD card connector, or an audio connector (e.g., a headphone connector).

The haptic module 1279 may convert an electrical signal into a mechanical stimulus (e.g., a vibration or a movement) or electrical stimulus which may be recognized by a user via his tactile sensation or kinesthetic sensation. According to an embodiment, the haptic module 1279 may include, for example, a motor, a piezoelectric element, or an electric stimulator.

The camera module 1280 may capture a still image or moving images. According to an embodiment, the camera module 1280 may include one or more lenses, image sensors, image signal processors, or flashes.

The power management module 1288 may manage power supplied to the electronic device 1201. According to one embodiment, the power management module 1288 may be implemented as at least part of, for example, a power management integrated circuit (PMIC).

The battery 1289 may supply power to at least one component of the electronic device 1201. According to an embodiment, the battery 1289 may include, for example, a primary cell which is not rechargeable, a secondary cell which is rechargeable, or a fuel cell.

The communication module 1290 may support establishing a direct (e.g., wired) communication channel or a wireless communication channel between the electronic device 1201 and the external electronic device (e.g., the electronic device 1202, the electronic device 1204, or the server 1208) and performing communication via the established communication channel. The communication module 1290 may include one or more communication processors that are operable independently from the processor 1220 (e.g., the application processor (AP)) and supports a direct (e.g., wired) communication or a wireless communication. According to an embodiment, the communication module 1290 may include a wireless communication module 1292 (e.g., a cellular communication module, a short-range wireless communication module, or a global navigation satellite system (GNSS) communication module) or a wired communication module 1294 (e.g., a local area network (LAN) communication module or a power line communication (PLC) module). A corresponding one of these communication modules may communicate with the external electronic device via the first network 1298 (e.g., a short-range communication network, such as Bluetooth™ wireless-fidelity (Wi-Fi) direct, or infrared data association (IrDA)) or the second network 1299 (e.g., a long-range communication network, such as a legacy cellular network, a 5th generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1292 may identify and authenticate the electronic device 1201 in a communication network, such as the first network 1298 or the second network 1299, using subscriber information (e.g., international mobile subscriber identity (IMSI)) stored in the subscriber identification module 1296.

The wireless communication module 1292 may support a 5G network, after a 4th generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1292 may support a high-frequency band (e.g., the millimeter wave (mmWave) band) to achieve, e.g., a high data transmission rate. The wireless communication module 1292 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1292 may support various requirements specified in the electronic device 1201, an external electronic device (e.g., the electronic device 1204), or a network system (e.g., the second network 1299). According to an embodiment, the wireless communication module 1292 may support a peak data rate (e.g., 20 Gbps or more) for implementing eMBB, loss coverage (e.g., 1264 dB or less) for implementing mMTC, or U-plane latency (e.g., 0.5 ms or less for each of downlink (DL) and uplink (UL), or a round trip of 12 ms or less) for implementing URLLC.

The antenna module 1297 may transmit or receive a signal or power to or from the outside (e.g., the external electronic device) of the electronic device 1201. According to an embodiment, the antenna module 1297 may include an antenna including a radiating element composed of a conductive material or a conductive pattern formed in or on a substrate (e.g., a printed circuit board (PCB)). According to an embodiment, the antenna module 1297 may include a plurality of antennas (e.g., array antennas). In such a case, at least one antenna appropriate for a communication scheme used in the communication network, such as the first network 1298 or the second network 1299, may be selected, for example, by the communication module 1290 (e.g., the wireless communication module 1292) from the plurality of antennas. The signal or the power may then be transmitted or received between the communication module 1290 and the external electronic device via the selected at least one antenna. According to an embodiment, another component (e.g., a radio frequency integrated circuit (RFIC)) other than the radiating element may be additionally formed as part of the antenna module 1297.

According to various embodiments, the antenna module 1297 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1201 and the external electronic device 1204 via the server 1208 coupled with the second network 1299. Each of the electronic devices 1202 or 1204 may be a device of a same type as, or a different type, from the electronic device 1201. According to an embodiment, all or some of operations to be executed at the electronic device 1201 may be executed at one or more of the external electronic devices 1202, 1204, or 1208. For example, if the electronic device 1201 should perform a function or a service automatically, or in response to a request from a user or another device, the electronic device 1201, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1201. The electronic device 1201 may provide the outcome, with or without further processing of the outcome, as at least part of a reply to the request. To that end, a cloud computing, distributed computing, mobile edge computing (MEC), or client-server computing technology may be used, for example. The electronic device 1201 may provide ultra low-latency services using, e.g., distributed computing or mobile edge computing. In another embodiment, the external electronic device 1204 may include an internet-of-things (IoT) device. The server 1208 may be an intelligent server using machine learning and/or a neural network. According to an embodiment, the external electronic device 1204 or the server 1208 may be included in the second network 1299. The electronic device 1201 may be applied to intelligent services (e.g., smart home, smart city, smart car, or healthcare) based on 5G communication technology or IoT-related technology.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1240) including one or more instructions that are stored in a storage medium (e.g., internal memory 1236 or external memory 1238) that is readable by a machine (e.g., the electronic device 1201). For example, a processor (e.g., the processor 1220) of the machine (e.g., the electronic device 1201) may invoke at least one of the one or more instructions stored in the storage medium, and execute the one or more instructions, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various embodiments of the disclosure, an electronic device may include a housing which includes a first housing for forming a side surface and a rear surface of the electronic device and a second housing connected to the first housing to slide within a designated range, a flexible display viewed in at least one area to outside of the electronic device through a front surface of the electronic device, and including a display panel and a reinforcing sheet, the flexible display including a first portion exposed to outside of the housing and a second portion extended from the first portion, and drawn in or out of the housing as the second housing moves with respect to the first housing, a circuit board disposed inside the first housing, and a fingerprint sensor spaced from a rear surface of the flexible display, and disposed on the circuit board, and the reinforcing sheet may include a first opening area disposed between the fingerprint sensor and the display panel with the second portion drawn in and a second opening area disposed between the fingerprint sensor and the display panel with the second portion drawn out.

According to an embodiment, the reinforcing sheet may include a shielding sheet formed with a material which blocks electromagnetic waves.

According to an embodiment, the shielding sheet ma include a copper (Cu) sheet.

According to an embodiment, the reinforcing sheet may further include a cushion sheet, the cushion sheet may be attached to a rear surface of the display panel, and the shielding sheet may be attached to a rear surface of the cushion sheet.

According to an embodiment, the first opening area and the second opening area of the reinforcing sheet may be disposed in the first portion of the flexible display.

According to an embodiment, the circuit board may include an FPCB, and the fingerprint sensor is disposed on the FPCB.

According to an embodiment, the fingerprint sensor may be connected with the FPCB through a wire.

According to an embodiment, the fingerprint sensor may include an optical fingerprint sensor.

According to an embodiment, the electronic device may further include a first transparent optical film disposed in the first opening area and a second transparent optical film disposed in the second opening area.

According to an embodiment, the reinforcing sheet may include the first opening area and the second opening area, and include a third opening area disposed between the display panel and the fingerprint sensor on a movement path of the flexible display built as the second housing moves while the second portion of the flexible display is drawn in.

According to an embodiment, the reinforcing sheet may include a guide member which surrounds the third opening area, and the fingerprint sensor may include a hook connected with the guide member.

According to an embodiment, the fingerprint sensor may include a first surface facing a rear surface of the flexible display and a second surface facing away from the first surface, and further include a sweeper member disposed in an area surrounding the fingerprint sensor on the first surface.

According to an embodiment, the electronic device may further include a processor electrically connected with the flexible display, and the fingerprint sensor, the processor may, in response to fingerprint recognition event occurrence for receiving fingerprint information, display a fingerprint recognized object in a first fingerprint detection area of the display panel with the second portion drawn in, and display the fingerprint recognized object in a second fingerprint detection area of the display panel with the second portion drawn out, the first fingerprint detection area may correspond to the first opening area, and the second fingerprint detection area may correspond to the second opening area.

According to an embodiment, the first fingerprint detection area and the second fingerprint detection area may be disposed in the first portion of the flexible display.

According to an embodiment, the fingerprint sensor may include an optical sensor, and the optical sensor may further include an aperture disposed on the optical sensor.

According to various embodiments of the disclosure, an electronic device may include a housing which includes a first housing forming a side surface and a rear surface of the electronic device and a second housing connected to the first housing to slide within a designated range, a flexible display viewed in at least one area to outside of the electronic device through a front surface of the electronic device, and including a display panel and a reinforcing sheet, the flexible display including a first portion exposed to outside of the housing and a second portion extended from the first portion, and drawn in or out of the housing as the second housing moves with respect to the first housing, a circuit board disposed inside the first housing, and a fingerprint sensor spaced from a rear surface of the flexible display, and disposed on the circuit board, and the reinforcing sheet may be disposed between the display panel and the fingerprint sensor, and include a slit area corresponding to an area where the fingerprint sensor is disposed as the second housing moves.

According to an embodiment, the reinforcing sheet may include a shielding sheet.

According to an embodiment, the slit area of the shielding sheet may be disposed in the first portion of the flexible display.

According to an embodiment, the fingerprint sensor may include an optical fingerprint sensor.

According to an embodiment, a transparent optical film may be s disposed in the slit area of the reinforcing sheet.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
    a housing comprising:
        a first housing, and
        a second housing slidably coupled to the first housing;
    a flexible display in which a portion exposed to the exterior changes when the second housing moves with respect to the first housing; and
    a fingerprint sensor arranged below the flexible display, wherein the flexible display comprises:
        a rear sheet,
        a first opening area disposed at a first area of the rear sheet, and
        a second opening area disposed at a second area of the rear sheet,
    wherein the fingerprint sensor obtains fingerprint information through the first opening area in a first state of the electronic device in which the second housing is in a drawn in position and obtains the fingerprint information through the second opening area in a second state of the electronic device in which the second housing is in a drawn out position.

2. The electronic device of claim 1, wherein the rear sheet comprises a shielding sheet formed with a material which blocks electromagnetic waves.

3. The electronic device of claim 2, wherein the shielding sheet is formed of a copper (Cu) sheet.

4. The electronic device of claim 2,
    wherein the rear sheet comprises a cushion sheet, wherein the cushion sheet is attached to a rear surface of a display panel of the flexible display, and wherein the shielding sheet is attached to a rear surface of the cushion sheet.

5. The electronic device of claim 1, wherein the first opening area and the second opening area are disposed in a first portion of the flexible display, in which exposed to the exterior of the housing in the first state.

6. The electronic device of claim 1,
wherein the electronic device comprises circuit board comprising a flexible printed circuit board (FPCB), and
wherein the fingerprint sensor is disposed on the FPCB.

7. The electronic device of claim 6, wherein the fingerprint sensor is connected with the FPCB through a wire.

8. The electronic device of claim 1, wherein the fingerprint sensor comprises an optical fingerprint sensor.

9. The electronic device of claim 1, further comprising:
a first transparent optical film disposed in the first opening area; and
a second transparent optical film disposed in the second opening area.

10. The electronic device of claim 1, wherein the rear sheet further comprises:
a third opening area disposed on the rear sheet between the first opening area and the second opening area on a movement path of the flexible display built as the second housing moves while the exposed portion of the flexible display is drawn in.

11. The electronic device of claim 10,
wherein the rear sheet comprises a guide member which surrounds the third opening area, and
wherein the fingerprint sensor comprises a hook connected with the guide member.

12. The electronic device of claim 1, wherein the fingerprint sensor comprises:
a first surface facing a rear surface of the flexible display,
a second surface facing away from the first surface, and
a sweeper member disposed in an area surrounding the fingerprint sensor on the first surface.

13. The electronic device of claim 1, further comprising:
at least one processor, and
memory storing instructions,
wherein the instructions, executed by the at least one processor, cause the electronic device to,
in response to receiving fingerprint information:
display a fingerprint recognized object in a first fingerprint detection area of the flexible display in the first state, and
display the fingerprint recognized object in a second fingerprint detection area of the flexible display in the second state, and
wherein the first fingerprint detection area corresponds to the first opening area, and the second fingerprint detection area corresponds to the second opening area.

14. The electronic device of claim 13, wherein the first fingerprint detection area and the second fingerprint detection area are disposed in a first portion of the flexible display, which is exposed to the exterior of the housing in the first state.

15. The electronic device of claim 1,
wherein the fingerprint sensor comprises an optical sensor, and
wherein the optical sensor comprises an aperture disposed on the optical sensor.

16. An electronic device comprising:
a housing comprising:
a first housing, and
a second housing slidably coupled to the first housing;
a flexible display in which a portion exposed to the exterior changes when the second housing moves with respect to the first housing; and
a fingerprint sensor arranged below the flexible display;
wherein the flexible display comprises:
a rear sheet comprising a slit area disposed such that the fingerprint sensor remains under the slit area as the second housing moves, and
wherein the fingerprint sensor obtains a fingerprint information through the slit area.

17. The electronic device of claim 16, wherein the rear sheet comprises a shielding sheet.

18. The electronic device of claim 17, wherein the slit area of the shielding sheet is disposed in a first portion of the flexible display, which is exposed to the exterior of the housing while the flexible display is in a drawn in state.

19. The electronic device of claim 16, wherein the fingerprint sensor comprises an optical fingerprint sensor.

20. The electronic device of claim 16, wherein a transparent optical film is disposed in the slit area of the rear sheet.

21. The electronic device of claim 16, wherein the slit area is an opening in the rear sheet.

22. The electronic device of claim 21, wherein the rear sheet comprises:
a guide member entirely surrounding the slit area.

23. The electronic device of claim 22,
wherein the guide member includes a receiving member, and
wherein the fingerprint sensor includes a hook configured to couple with the receiving member.

24. The electronic device of claim 16,
wherein the fingerprint sensor includes an aperture, and
wherein the electronic device comprises at least one processor and memory storing one or more computer programs,
wherein the one or more computer programs include computer-executable instructions that, when executed by the at least one processor, cause the electronic device to:
open the aperture in response to detecting contact of an external object, and
close the aperture when the contact of the external object is no longer detected.

* * * * *